United States Patent
Kang et al.

[11] Patent Number: 6,146,999
[45] Date of Patent: Nov. 14, 2000

[54] METHOD FOR FORMING METAL LINE OF SEMICONDUCTOR DEVICE

[75] Inventors: Dong Man Kang; Jung Ho Kang, both of Chungcheongbuk-do, Rep. of Korea

[73] Assignee: Hyundai Electronics Industries Co., Ltd., Ichon, Rep. of Korea

[21] Appl. No.: 08/956,387

[22] Filed: Oct. 23, 1997

[30] Foreign Application Priority Data

Aug. 14, 1997 [KR] Rep. of Korea ..................... 97/38880

[51] Int. Cl.⁷ .............................. H01L 21/82; H01L 21/44
[52] U.S. Cl. ......................... 438/662; 438/131; 438/600; 438/669; 438/682; 438/684
[58] Field of Search ................................... 438/131, 587, 438/600, 662, 669, 682, 684, 685, 598

[56] References Cited

U.S. PATENT DOCUMENTS

| 4,630,355 | 12/1986 | Johnson | 29/575 |
| 4,835,118 | 5/1989 | Jones | 437/173 |
| 4,931,353 | 6/1990 | Tanielian | 437/200 |

OTHER PUBLICATIONS

Wolf, S.; "Silicon Processing for the VLSI Era, vol.2—Process Integration", 1990.

*Primary Examiner*—Charles Bowers
*Assistant Examiner*—Nema Berezny
*Attorney, Agent, or Firm*—Fleshner & Kim, LLP

[57] ABSTRACT

A method for forming a metal line of a semiconductor device is suitable for forming a conductive material with strong connection force, by irradiating the region between metals to be connected with each other, with laser beams. It comprises the steps of: forming a plurality of metal lines on a substrate; depositing a first conductive material over the substrate including the metal lines; irradiating the first conductive material between the metal lines to be connected, with laser beams, before forming a second conductive material; and removing the first conductive material excluding the second conductive material.

14 Claims, 5 Drawing Sheets

F I G.3
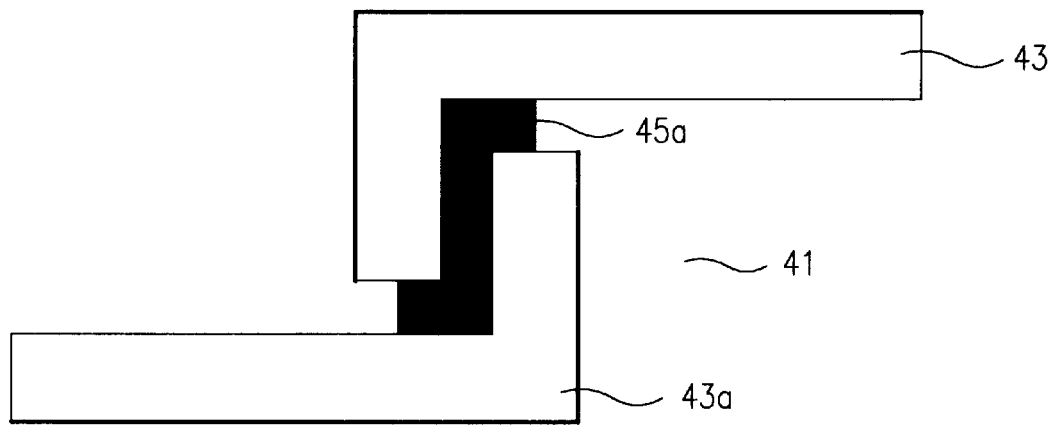

F I G.4a
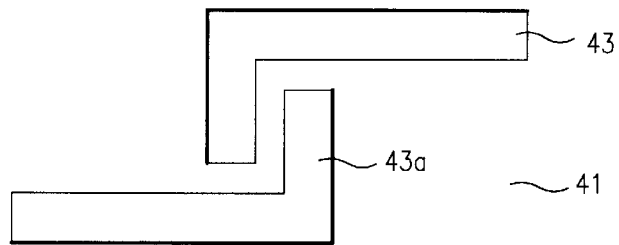
F I G.4b
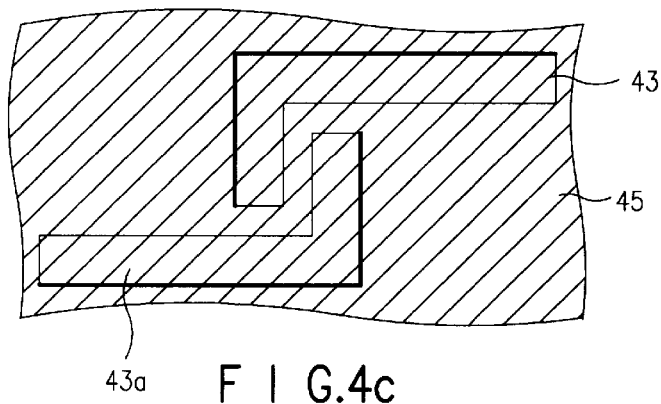
F I G.4c
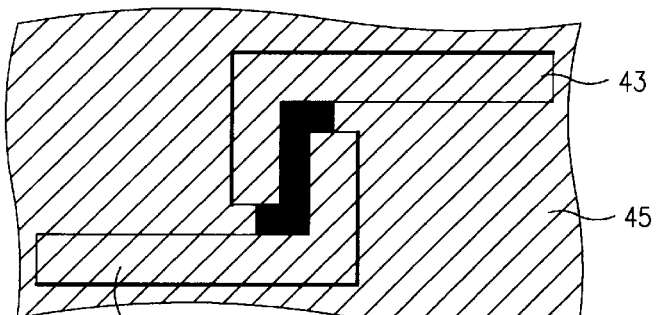
F I G.4d
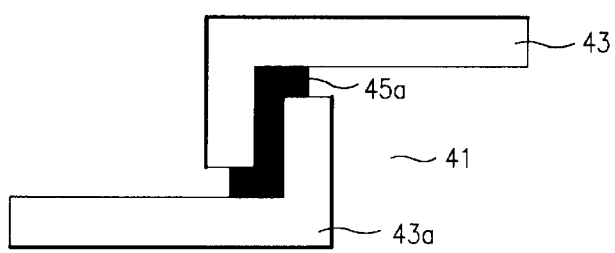

F I G.5
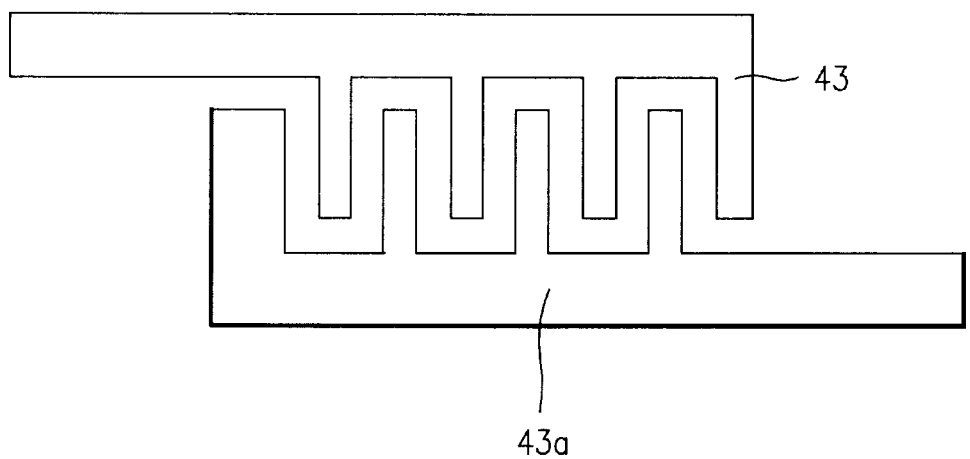

METHOD FOR FORMING METAL LINE OF SEMICONDUCTOR DEVICE

BACKGROUND OF THE INVENTION

1. Field of the Invention

The present invention relates to a semiconductor device. More particularly, it relates to a method for forming a metal line of a semiconductor device which is suitable for reducing TAT (turn around time) at the time of forming of a gate array, and for simplifying processing with no additional mask.

2. Discussion of Related Art

Generally, the gate array serves to selectively connect a plurality of gates arranged in parallel through a metal line.

The characteristics of device depend on how the metal line is connected.

That is, the existing standard cells are to predetermine the device and metal line structure before manufacturing a chip, while the gate array is to predetermine the gate and device to be connected in parallel and then decide the metal line in accordance with the specification of products where a chip is to be mounted.

The following description relates to a conventional method for forming a metal line of a semiconductor device, referring to the appended drawings.

All processing steps after fabricating of a device are the stand-by state until customer's demands.

That is to say, after the fabrication of device is completed and before a contact hole is formed to connect the device with the metal line, processing is stopped to comply with the demands of the customers having different metal line layouts.

Therefore, all processings are finally stopped, after fabricating of device, followed by the formation of interlevel insulating layers.

FIGS. 1a to 1d are cross-sectional views, showing a method for forming a metal line of a semiconductor device according to a conventional first preferred embodiment.

As shown in FIG. 1a, a first metallic layer is formed on a wafer 11, before covered with photoresist (not shown).

The photoresist is patterned by exposure and developing, before the first metallic layer is selectively removed by using a mask, so that a plurality of first metal lines 13 are formed.

As depicted in FIG. 1b, a first interlevel insulating layer 15 is formed over the surface of the wafer 11 including the first metal lines 13.

When the above-mentioned processing is finished, all processings are stopped until the first interlevel insulating layer 15 is selectively removed in accordance with the metal line layout provided by customers.

That is, the first interlevel insulating layer 15 is selectively removed to expose the surface of a random first metal line 13 among the plural first metal lines 13.

The random first metal line indicates a metal line required for forming a line to satisfy customer's demands.

First tungsten 17 is deposited over the surface of the wafer 11 including the exposed first metal lines 13, and etched back away.

As shown in FIG. 1c, a second metallic layer is formed all over the surface of the wafer 11 including the first tungsten 17 and first interlevel insulating layer 15 and selectively removed to form second metal lines 19.

Here, one of the second metal lines 19 is electrically connected to the above random first metal line 13 by means of the first tungsten 17.

As illustrated in FIG. 1d, a second interlevel insulating layer 21 is formed over the surface of the wafer 11 including the second metal lines 19.

And then the second interlevel insulating layer 21 is selectively removed to expose the surface of a random second metal line 19 among the second metal lines 19.

The random second metal line 19 is also selected in accordance with the customer's demands.

Second tungsten 23 is deposited over the surface of the wafer 11 including the exposed second metal lines 19 and second interlevel insulating layer 21, and etched back away.

The repetition of such a processing serves to perform the multilayer metal line process.

FIG. 2 shows a method for forming a metal line of a semiconductor device according to a conventional second preferred embodiment, which is an FPGA (field programmable gate array) presented by Light speed in U.S.

As shown in FIG. 2, the method presented by Light speed is directly connecting two metals by using laser beam, in order to form a metal line.

That is to say, a via contact hole 35 is formed to electrically connect lower metal line 31 with upper metal line 33 that is formed by interlevel insulating layer (not shown) interposed therebetween.

Metal 37 connected to the via contact hole 35 is connected with the upper metal line 33, to form a metal line.

The region (dotted line) where the two metals 33 and 37 are connected, is irradiated by laser beams, to directly connect the two metals 33 and 37.

This intends to reduce TAT by using laser beams after metal patterning, in comparison with the conventional first preferred embodiment.

The conventional method for forming a metal line of a semiconductor device as constructed above has the following problems.

First, according to the conventional first preferred embodiment, all the processings after fabricating of device are stopped until customer's demands, so that it takes much time TAT to fabricate a chip after first processing.

Second, according to the conventional second preferred embodiment, two metals are directly connected with each other. Here, the contact between two metals is poor, thereby deteriorating the reliability of device.

Third, according to the conventional first preferred embodiment, process is performed in the range of 7~12V. Therefore, the line of device is less than 0.5 $\mu$m, namely, 0.35 $\mu$m, 0.25 $\mu$m in width, resulting in the junction breakdown due to high voltage. And then FPGA chip cannot be used in the range below 0.5 $\mu$m.

SUMMARY OF THE INVENTION

Accordingly, the present invention is directed to a method for forming a metal line of a semiconductor device that substantially obviates one or more of the problems due to limitations and disadvantages of the related art.

An object of the present invention is to provide a method for forming a metal line of a semiconductor device, which can reduce TAT, enhance reliability of a device, and apply FPGA to a device with a line of small width.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming the metal line of the semiconductor device, comprises the steps of: forming a plurality of metal lines on a semiconductor substrate; depositing a first material which can be silicified, over the surface including the metal lines; irradiating the first material corresponding to the region where the metal lines are connected with each other, with laser beams, before forming a conductive material; and removing the first material excluding the conductive material.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 3 is a plan view of a metal line structure of a semiconductor device according to the present invention.

FIGS. 4a to 4d show a layout of the method for forming the metal line of the semiconductor device of the present invention.

FIG. 5 is a plan view of another preferred embodiment according to the metal line structure of the semiconductor device of the present invention.

DETAILED DESCRIPTION OF PREFERRED EMBODIMENT

Figure 1A:
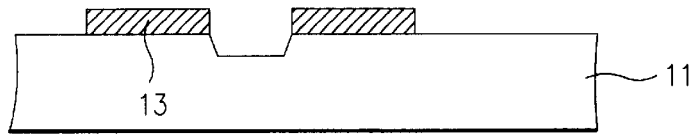
FIGS. 1a to 1d are cross-sectional views showing steps of a method for forming a metal line of a semiconductor device according to a conventional preferred embodiment.
Figure 1B:
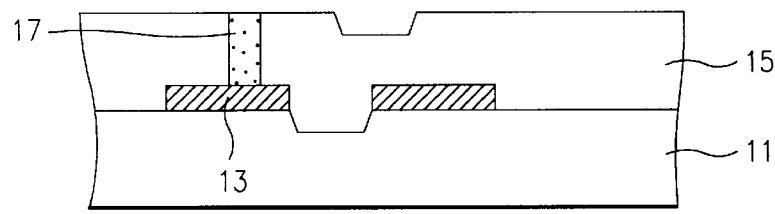
Figure 1C:
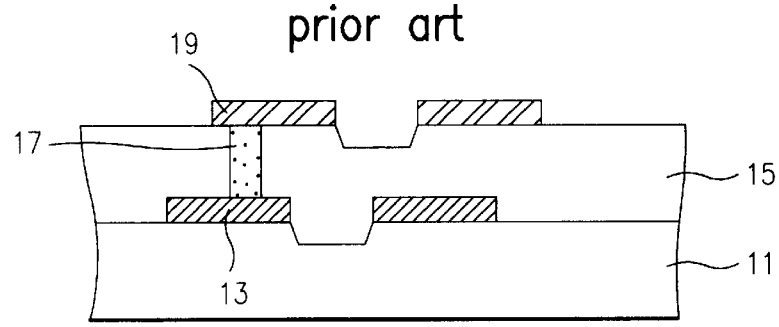
Figure 1D:
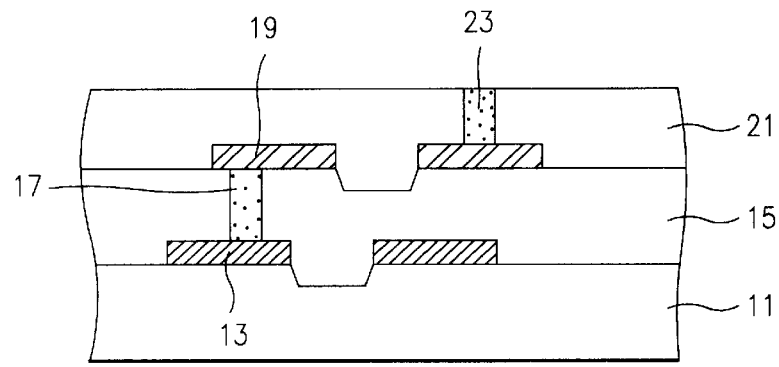
Figure 2:
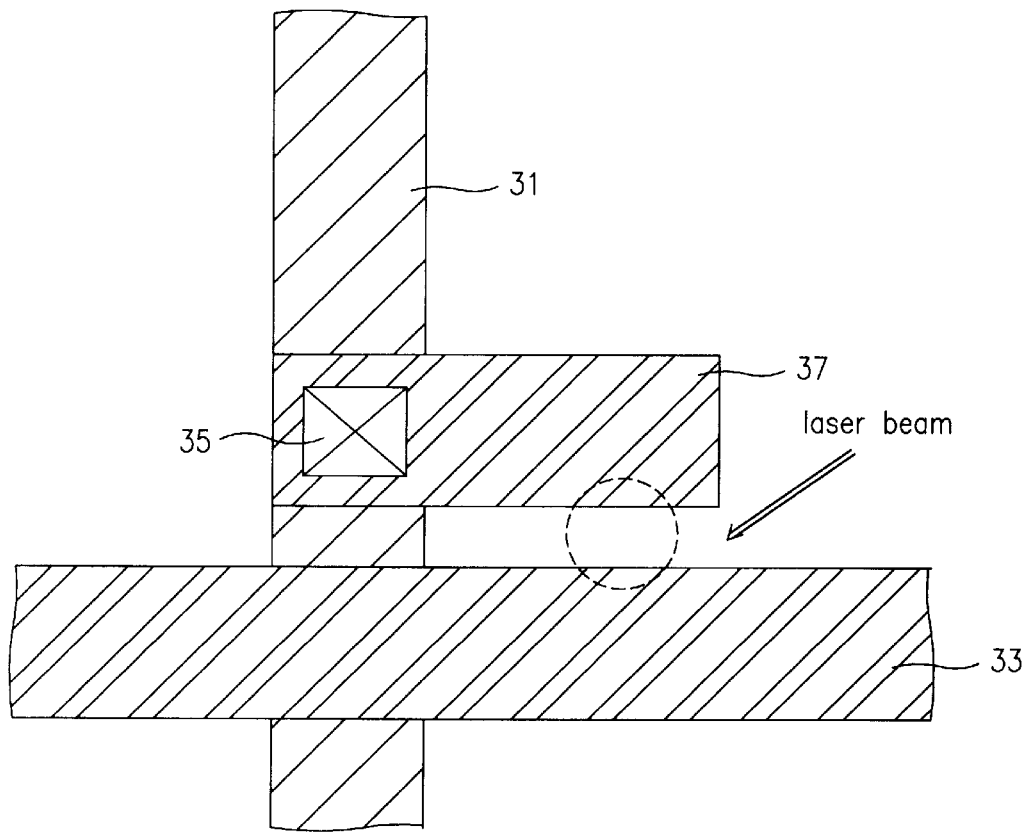
FIG. 2 shows a layout of the method for forming the metal line of the semiconductor device according to a conventional preferred embodiment.

Reference will now be made in detail to the preferred embodiments of the present invention, examples of which are illustrated in the accompanying drawings.

FIG. 3 is a plan view of a metal line structure of a semiconductor device according to the present invention.

That is, there are provided a bent first metal line 43, a second metal line 43a which is bent symmetrically with the first metal line 43, and a silicide 45a which electrically connects the bent portions of the first and second metal lines 43 and 43a.

The following description relates to the method for forming the metal line of the semiconductor device according to the present invention, as constructed above.

FIGS. 4a to 4d are cross-sectional views, showing the method for forming the metal line of the semiconductor device of the present invention.

As shown in FIG. 4a, metal is deposited over a semiconductor substrate 41.

One of Titanium (Ti), Tungsten (W), Titanium Nitride (TiN), and Titanium Tungsten (TiW) is used as the metal.

The wafer surface 41 including the metal is covered with photoresist (not illustrated), before patterning the photoresist by use of exposure and developing.

The photoresist patterned is etched by using a mask, for the purpose of selectively removing the metal, so that a plurality of metal lines 43 are formed.

The metal lines 43 are designed and patterned, enough to maximize the electrical conductivity between the two metals.

As shown in FIG. 3, that is to say, the bent portions of the respective metal lines 43 and 43a are opposite to each other, thereby enhancing the electrical conductivity between the two metals, in comparison with metal lines patterned parallel with each other.

FIG. 5 shows another preferred embodiment, which is patterning the shape of metals, to enhance the electrical conductivity.

As depicted in FIG. 5, the region where the first and second metal lines 43 and 43a are in contact with each other, is patterned, having prominences and depressions, and in the region a silicide is formed.

Subsequently, the metal lines 43 and 43a are formed, complying with the customer's demands.

The following description relates to the above-mentioned metal line forming process.

As shown in FIG. 3b, namely, a first material 45 capable of being silicified is deposited over the semiconductor substrate 41 including the plural metal lines 43 and 43a.

The material 45 capable of being silicified includes a material for anti-fuse in a broad sense.

Generally, a fuse serves to cut off the electric connection between two metals through an external signal, while an anti-fuse serves to connect the two metals with each other through an external signal.

In this regard, the material for anti-fuse means the material capable of being silicified.

Subsequently, the first material 45 corresponding to the region where the metal lines 43 and 43a are connected with each other, is selectively exposed.

One of a-silicon (amorphous silicon) and polysilicon is used as the first material 45.

Thereafter, the first material 45 exposed is irradiated with laser beams.

As a preferred embodiment of the present invention, in case of irradiating of laser beams, energy of laser beams is adjusted to 3.0 $\mu$J, and spot size is to 2.5~6.5 $\mu$m (diameter), in ESIN9300 (equipments name).

Accordingly, as the first material 45 is irradiated with laser beams, it reacts with the metal line 43, so that a conductive material 45a is formed, as shown in FIG. 4c.

The conductive material 45a is a silicide, and its area is about 4.5×4.5 $\mu m^2$.

Connection force of two metals can be enhanced through such a silicide, in comparison with directly using laser beams to connnect the two metals.

As illustrated in FIG. 4d, the first material 45 excluding the conductive material 45a formed by irradiation of laser beams, is removed, and then the metal line process of semiconductor device is completed.

As described above, the effect of the method for forming the metal line of the semiconductor device according to the present invention is as followings;

First, the time required for metal line process is reduced, thereby reducing TAT in general.

Second, there is no need to form the respective masks every time there are the customer's demands, thereby decreasing the mask cost.

Third, a silicide with strong connection force is formed between the metals, and therefore, the metals are electrically connected well, thereby enhancing reliability of device.

Fourth, the metals are connected by means of laser beams, instead of power supplied, so that FPGA can be applied to the device with a line of small width.

It will be apparent to those skilled in the art that various modifications and variations can be made in a method for forming a metal line of a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a metal line of a semiconductor device, comprising the steps of:

forming a plurality of metal lines on a wafer, wherein said metal lines are deposited on the same level with respect to the substrate surface;

depositing a first material which can be silicified, over the wafer including the metal lines, wherein the first material is at least one of a polysilicon layer and an amorphous silicon layer;

irradiating a portion of the first material where the metal lines are adjacent each other, with laser beams, thereby forming a conductive material to connect the metal lines with each other; and removing portions of the first material excluding the conductive material, wherein bent portions of the metal lines are opposite to each other to maximize the effect of electrical conductivity therebetween.

2. The method defined in claim 1, wherein the metal lines are a material selected from a group consisting essentially of: Titanium (Ti), Tungsten (W), Titanium Nitride (TiN), and Titanium Tungsten (TiW).

3. The method defined in claim 1, wherein the conductive material is a silicide.

4. A method for forming a metal line of a semiconductor device, comprising the steps of:

forming a plurality of metal lines on a wafer, wherein said metal lines are deposited on the same level with respect to the substrate surface;

forming an amorphous silicon layer over the wafer including the metal lines;

irradiating a portion of the amorphous silicon layer where the metal lines are adjacent each other, with laser beams, thereby forming a silicide layer to connect the metal lines with each other; and removing the residual amorphous silicon layer, wherein the spot size of the laser beams is adjusted to 2.5~6.5 $\mu$m (diameter), and the energy there is adjusted to 3.0 $\mu$J.

5. The method defined in claim 4, wherein a polysilicon layer is substituted for the amorphous silicon layer.

6. The method defined in claim 4, wherein the metal lines are a material selected from a group consisting essentially of: Titanium (Ti), Tungsten (W), Titanium Nitride (TiN), and Titanium Tungsten (TiW).

7. The method defined in claim 4, wherein the amorphous silicon of the region irradiated with laser beams is selectively exposed.

8. A method for forming a metal line of a semiconductor device, comprising the steps of:

forming first and second metal lines on a substrate, wherein said first and second metal lines are deposited on the same level with respect to the substrate surface;

forming a material layer for anti-fuse, over the substrate including the first and second metal lines, wherein the material layer is at least one of a polysilicon layer and an amorphous silicon layer;

irradiating a portion of the material layer corresponding to the region where the first and second metal lines are adjacent to each other, with laser beams; and removing the region which is not irradiated with laser beams, from the material layer, wherein the first and second metal lines are bent to be adjacent to each other.

9. The method defined in claim 8, wherein the line or edge of adjacent region of the first and second metal lines is less than 6.5 $\mu$m.

10. The method defined in claim 9, wherein the first and second metal lines are a material selected from a group consisting essentially of: Titanium (Ti), Tungsten (W), Titanium Nitride (TiN), and Titanium Tungsten (TiW).

11. The method defined in claim 8, wherein the material layer is formed as a material which can be silicified.

12. The method defined in claim 8, wherein irradiating the material layer corresponding to the region where the first and second metal lines are adjacent to each other, converts said region into a conductive material.

13. The method defined in claim 8, wherein the conductive material is a silicide.

14. A method for forming a metal line of a semiconductor device, comprising the steps of:

forming first and second metal lines on a substrate, wherein said first and second metal lines are deposited on the same level with respect to the substrate surface;

forming a material layer for anti-fuse, over the substrate including the first and second metal lines, wherein the material layer is at least one of a polysilicon layer and an amorphous silicon layer;

irradiating a portion of the material layer corresponding to the region where the first and second metal lines are adjacent to each other, with laser beams; and removing the region which is not irradiated with laser beams, from the material layer, wherein the conductive material is a suicide and the area of silicide is less than $4.5 \times 4.5$ $\mu$m$^2$.

* * * * *